(12) United States Patent
Pillarisetty et al.

(10) Patent No.: US 10,050,015 B2
(45) Date of Patent: Aug. 14, 2018

(54) MULTI-DEVICE FLEXIBLE ELECTRONICS SYSTEM ON A CHIP (SOC) PROCESS INTEGRATION

(71) Applicants: Ravi Pillarisetty, Portland, OR (US); Sansaptak Dasgupta, Hillsboro, OR (US); Niloy Mukherjee, Portland, OR (US); Brian S. Doyle, Portland, OR (US); Marko Radosavljevic, Portland, OR (US); Han Wui Then, Portland, OR (US)

(72) Inventors: Ravi Pillarisetty, Portland, OR (US); Sansaptak Dasgupta, Hillsboro, OR (US); Niloy Mukherjee, Portland, OR (US); Brian S. Doyle, Portland, OR (US); Marko Radosavljevic, Portland, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/121,759

(22) PCT Filed: Mar. 27, 2014

(86) PCT No.: PCT/US2014/032037
§ 371 (c)(1),
(2) Date: Aug. 25, 2016

(87) PCT Pub. No.: WO2015/147835
PCT Pub. Date: Oct. 1, 2015

(65) Prior Publication Data
US 2017/0069596 A1    Mar. 9, 2017

(51) Int. Cl.
*H01L 29/10* (2006.01)
*H01L 29/12* (2006.01)
(Continued)

(52) U.S. Cl.
CPC ........ *H01L 25/0652* (2013.01); *G06F 1/1652* (2013.01); *G09F 9/301* (2013.01);
(Continued)

(58) Field of Classification Search
CPC ............................ H01L 25/0652; H01L 29/24
(Continued)

(56) References Cited

U.S. PATENT DOCUMENTS

| 5,901,041 A | * | 5/1999 | Davies | H01L 23/3107 |
| | | | | 174/16.3 |
| 2009/0166065 A1 | * | 7/2009 | Clayton | H05K 1/189 |
| | | | | 174/254 |

(Continued)

FOREIGN PATENT DOCUMENTS

JP        2009-135350 A     6/2009

OTHER PUBLICATIONS

International Preliminary Report on Patentability dated Oct. 6, 2016, issued in corresponding International Application No. PCT/US2014/032037, 8 pages.
(Continued)

*Primary Examiner* — Jami M Valentine
(74) *Attorney, Agent, or Firm* — Schwabe, Williamson & Wyatt, P.C.

(57) ABSTRACT

Embodiments of the present disclosure describe multi-device flexible systems on a chip (SOCs) and methods for making such SOCs. A multi-material stack may be processed sequentially to form multiple integrated circuit (IC) devices in a single flexible SOC. By forming the IC devices from a single stack, it is possible to form contacts for multiple devices through a single metallization process and for those contacts to be located in a common back-plane of the SOC. Stack layers may be ordered and processed according to processing temperature, such that higher temperature
(Continued)

processes are performed earlier. In this manner, intervening layers of the stack may shield some stack layers from elevated processing temperatures associated with processing upper layers of the stack. Other embodiments may be described and/or claimed.

27 Claims, 5 Drawing Sheets

(51) Int. Cl.
| | |
|---|---|
| H01L 25/065 | (2006.01) |
| H01L 25/00 | (2006.01) |
| H01L 29/20 | (2006.01) |
| H01L 29/24 | (2006.01) |
| G06F 1/16 | (2006.01) |
| G09F 9/30 | (2006.01) |
| G09G 3/36 | (2006.01) |
| H01L 21/8258 | (2006.01) |
| H01L 23/14 | (2006.01) |
| H01L 23/15 | (2006.01) |
| H01L 23/498 | (2006.01) |
| H01L 21/822 | (2006.01) |
| H01L 27/06 | (2006.01) |

(52) U.S. Cl.
CPC ....... *G09G 3/3648* (2013.01); *H01L 21/8258* (2013.01); *H01L 23/49811* (2013.01); *H01L 25/00* (2013.01); *H01L 25/50* (2013.01); *H01L 29/2003* (2013.01); *H01L 29/24* (2013.01); *H01L 21/8221* (2013.01); *H01L 23/145* (2013.01); *H01L 23/15* (2013.01); *H01L 23/4985* (2013.01); *H01L 27/0688* (2013.01); *H01L 2225/06527* (2013.01); *H01L 2225/06555* (2013.01); *H01L 2924/0002* (2013.01)

(58) Field of Classification Search
USPC .......................................... 257/43, E23.065
See application file for complete search history.

(56) References Cited

U.S. PATENT DOCUMENTS

| | | | |
|---|---|---|---|
| 2011/0108856 A1* | 5/2011 | Wu | ........................ H01L 27/288 257/80 |
| 2013/0168706 A1 | 7/2013 | Salam et al. | |
| 2013/0220408 A1 | 8/2013 | Bedell et al. | |
| 2014/0045283 A1 | 2/2014 | Hirakata et al. | |
| 2014/0070203 A1 | 3/2014 | Tanaka et al. | |

OTHER PUBLICATIONS

International Search Report and Written Opinion dated Dec. 24, 2014, issued in corresponding International Application No. PCT/US2014/032037, 11 pages.
Taiwan Office Action and Search Report dated Dec. 21, 2015, issued in corresponding Taiwan Patent Application No. 104104779.
Taiwan 2nd Office Action and Search Report dated Aug. 4, 2016, issued in corresponding Taiwan Patent Application No. 104104779.
Notification of Reasons for Refusal dated Sep. 27, 2017, issued in related Japanese Patent Application No. Patent Application No. 2016-551244, 5 pages.

* cited by examiner

MULTI-DEVICE FLEXIBLE ELECTRONICS SYSTEM ON A CHIP (SOC) PROCESS INTEGRATION

CROSS-REFERENCE TO RELATED APPLICATIONS

The present application is a national phase entry under 35 U.S.C. § 371 of International Application No. PCT/US2014/032037, filed Mar. 27, 2014, entitled "MULTI-DEVICE FLEXIBLE ELECTRONICS SYSTEM ON A CHIP (SOC) PROCESS INTEGRATION," which designates the United States of America, the entire disclosure of which is hereby incorporated by reference in its entirety and all purposes.

FIELD

Embodiments of the present disclosure generally relate to the field of integrated circuits, and more particularly, multi-device flexible system on a chip devices, as well as methods for fabricating such devices.

BACKGROUND

Generally, flexible integrated circuit (IC) package assemblies have involved the separate fabrication of IC devices, which are later fixed individually to a flexible substrate. In such systems, different IC devices are generally spaced apart laterally in the same plane. Connections between the devices may also be formed in areas between the devices in the plane where the devices are located.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
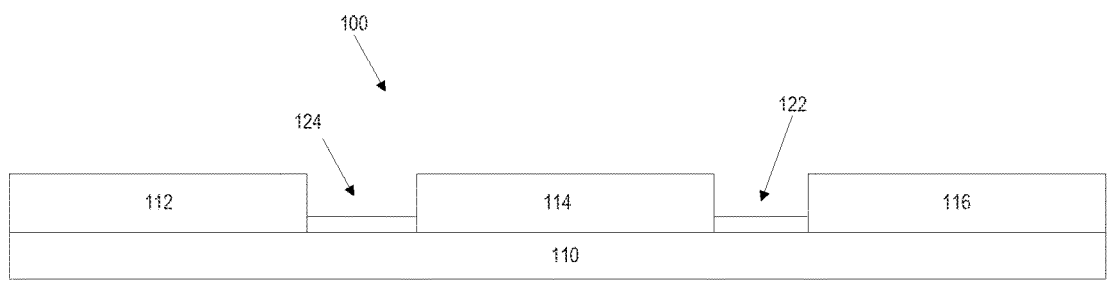
FIG. 1 schematically illustrates a cross-section side view of a flexible IC device according to traditional techniques.

Embodiments of the present disclosure include multi-device SOCs and methods of making multi-device SOCs. By sequentially processing different semiconductor layers, it may be possible to make a multi-device SOC in which all of the devices are formed on the same chip. This may allow for more direct connections between the different devices and may allow contacts for the various devices to be commonly located on the same plane. As such, transistor connections for all devices may share a common backplane.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "in embodiments," or "in some embodiments," which may each refer to one or more of the same or different embodiments. Furthermore, the terms "comprising," "including," "having," and the like, as used with respect to embodiments of the present disclosure, are synonymous.

The term "coupled with" along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SOC), a processor (shared, dedicated, or group) and/or memory (shared, dedicated, or group) that execute one or more software or firmware programs, a combinational logic circuit, and/or other suitable components that provide the described functionality.

FIG. 1 illustrates a flexible multi-device system 100 according to traditional assembly techniques. The system 100 may include three integrated circuit (IC) devices 112, 114, and 116. The IC devices may include any type of IC device and may include one each of a silicon (Si) logic device, an indium gallium zinc oxide (IGZO) display device, and a gallium nitride (GaN) radio device. Each IC device may include one or more transistors. In the arrangement shown in system 100, the devices 112, 114, and 116 are fabricated separately according to known processing techniques.

After fabrication, the devices 112, 114, and 116 may be transferred and attached to a flexible substrate 110 to form the flexible multi-device system 100. Connections 122 and 124 may be formed between the devices 112, 114, 116 to electrically couple the devices to one another. In the arrangement of system 100, the devices 112, 114, and 116 are laterally spaced apart in generally the same plane with connections 122, 124 formed between the devices also in the same plane.

Figure 2:
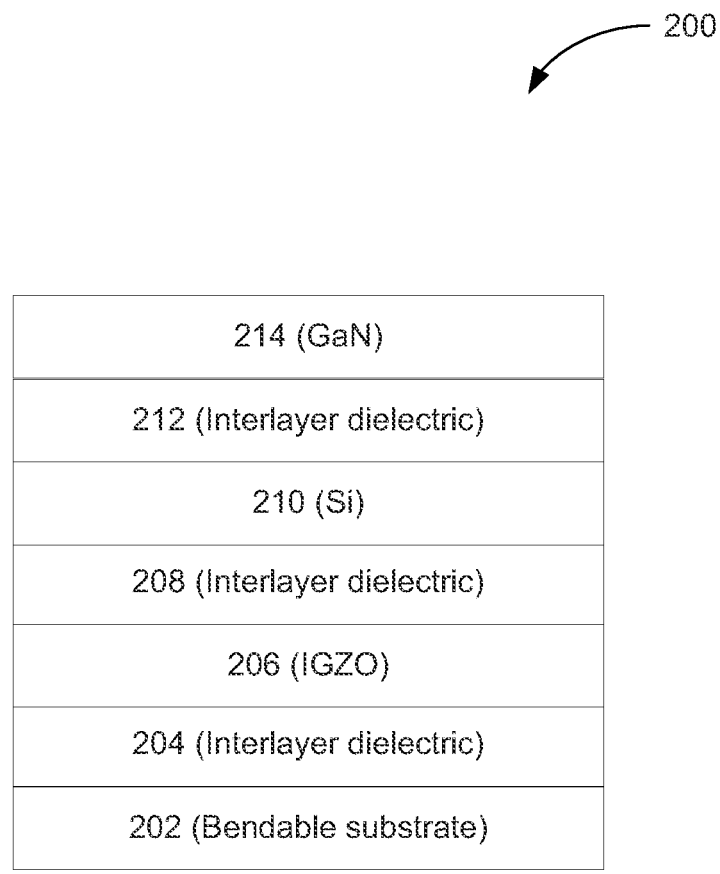
FIG. 2 schematically illustrates a cross-section side view of a multi-layer stack prior to processing, in accordance with some embodiments.

FIG. 2 illustrates a multi-layer stack 200 prior to device fabrication in accordance with some embodiments. The stack 200 may include a bendable substrate 202. The bendable substrate may be a flexible glass material, a polymer material, or another suitable flexible substrate material. In some embodiments, the stack may be processed on a traditional silicon substrate and then transferred to a flexible substrate after the devices have been formed. A first layer of interlayer dielectric (ILD) material 204 may be deposited on the substrate 202. A first semiconductor layer 206 may be deposited on the first layer of ILD material 204. In some embodiments, the first semiconductor material may be indium gallium zinc oxide (IGZO) to be used in forming a display device.

The stack 200 may also include a second layer of ILD material 208 deposited on the first layer of semiconductor material 206. A second layer of semiconductor material 210 may be deposited on the second layer of ILD material 208. The second layer of semiconductor material 210 may include a silicon (Si) layer to be used in forming a logic device.

The stack 200 may further include a third layer of ILD material 212 deposited on the second layer of semiconductor material 210. A third layer of semiconductor material 214 may be deposited on the third layer of ILD material 212. The third layer of semiconductor material may include GaN layer to be used in forming a radio device. The third layer of semiconductor material may include other III-V semiconductor materials rather than GaN in some embodiments.

Although shown with three layers of semiconductor material 206, 210, and 214, any number of layers of semiconductor material may be used in the stack based on the devices to be formed as discussed below. In some embodiments, the layers of semiconductor material 206, 210, and 214 may be arranged in order of maximum processing temperature. As discussed below, this may allow other layers of material in the stack to shield the lower layers (those closer to the substrate) from elevated processing temperatures associated with the processing of the upper layers (those further from the substrate). This may allow sequential processing of layers in order of maximum processing temperature to form a plurality of IC devices while preventing damages to other layers in the stack. Additionally, stack 200 may include multiple layers of the same semiconductor material in some embodiments. In some embodiments, the stack 200 may also include one or more layers of amorphous silicon (Si). For instance, a layer of amorphous Si may be included between the substrate 202 and the IGZO layer 206 or between the IGZO layer 206 and the Si layer 210. Such an amorphous Si layer may be separated from other semiconductor layers by one or more layers of interlayer dielectric material. These layers may be processed to form solar cells or batteries, which may be used to provide power to other IC devices. Similar to the other semiconductor layers, such layers may be arranged in the stack 200 in accordance with processing temperatures associated with fabricating the solar cell and/or battery or other power supply devices.

Figure 3:
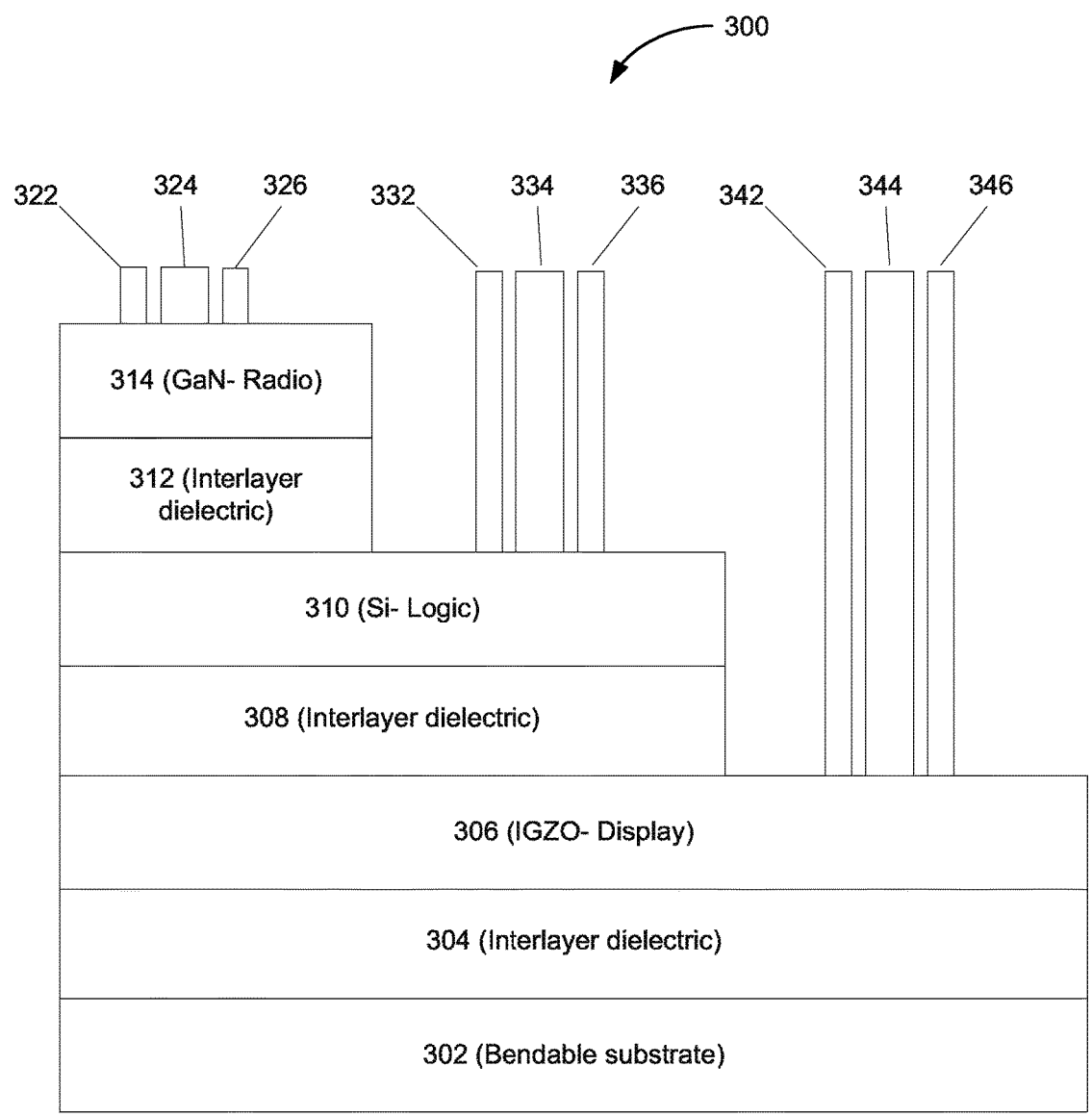
FIG. 3 schematically illustrates a cross-section side view of a multi-device system on a chip (SOC), in accordance with some embodiments.

FIG. 3 illustrates a multi-device SOC 300 according to some embodiments. The SOC 300 may be formed by processing a multi-layer stack 200. The SOC 300 may include a GaN based radio device 314. The GaN radio device 314 may be formed by processing semiconductor layer 214 of stack 200 according to known processing techniques. The GaN radio device 314 may provide radio functionality in accordance with any number of communications protocols as discussed in more detail below with reference to FIG. 5. Although shown as GaN radio device 314, other devices may be formed from a GaN layer and materials other than GaN may be used in layer 214 and subsequently device 314. A maximum processing temperature associated with forming GaN radio 314 may be greater than a maximum processing temperature associated with forming subsequent devices. The GaN radio 314 may be formed prior to the Si logic device 310 and the IGZO display device 306.

SOC 300 may include electrical contacts for transistors that are included in the GaN radio device 314. These may include an emitter contact 322, a base contact 324, and a collector contact 326. Although a single instance of each contact is shown (for clarity), any number of contacts may be included depending upon the structure of the GaN radio 314. As will be discussed below, the contacts for each of the IC devices may be formed through a common fabrication scheme and located in a common backplane of the SOC.

The SOC 300 may include an ILD layer 312 separating the GaN radio 314 from a Si logic device 310. The Si logic device 310 may be formed from semiconductor layer 210 of stack 200. The Si logic device 310 may be formed according to known techniques. When forming the Si logic device 310, the previously formed GaN radio device 314 may be masked. Forming the Si logic device 310 may include patterning portions of the GaN radio using a mask. Forming the Si logic device 310 may include removing portions of the GaN layer 214 and ILD layer 212 to expose the Si layer 210. In some embodiments, the Si logic device 310 may include a processor, memory, or a combination of a processor and memory. An ILD layer 308 may separate the Si logic device 310 from the IGZO display device 306. A maximum processing temperature associated with fabricating the Si logic device 310 may be less than a maximum temperature associated with forming the GaN radio device 314, but greater than a maximum processing temperature associated with forming an IGZO display device 306.

Similar to the GaN radio 314, the Si logic device 310 may include electrical contacts such as an emitter contact 332, a base contact 334, and a collector contact 336. Although a single instance of each contact is shown (for clarity), any number of contacts may be included depending upon the structure of the Si logic device 310.

SOC 300 may also include an IGZO display device 306. Similar to Si logic device 310, the IGZO display device 306 may be formed by known operations for processing IGZO. The formation of the IGZO display device 306 may include masking portions of the GaN radio 314 and/or the Si logic device 310. In some embodiments, portions of the GaN layer and/or the Si layer may be removed in forming the IGZO display device 306. A maximum processing temperature associated with forming the IGZO display device 306 may be less than a maximum temperature associated with forming either the GaN radio device 314 or the Si logic device 310. SOC 300 may include an ILD layer 304 separating the IGZO display device 306 from the substrate 302.

Similar to the devices discussed above, the IGZO display device 306 may include electrical contacts such as an emitter contact 342, a base contact 344, and a collector contact 346. Although a single instance of each contact is shown (for clarity), any number of contacts may be included depending upon the structure of the IGZO display device 306.

The SOC 300 may be formed directly on a bendable substrate 302 in some embodiments. In other embodiments, the various devices 314, 310, 306 may be formed while the multi-layer stack 200 is attached to a relatively rigid substrate (such as a Si substrate) and then transferred onto a bendable substrate 302 after fabrication. Although shown with three different IC devices, the SOC 300 may have more or fewer IC devices. The SOC may also include more than one of a single type of devices. This may be accomplished by forming multiple devices in a single layer of material (for instance forming multiple processors within Si layer 210) or by including multiple layers of the same material and processing them separately to form separate devices.

The SOC 300 may therefore provide a multi-layer device in which all of the IC devices (306, 310, 314) are located on a common chip. In this manner, the connections for all of the devices may be formed in a common process such that only a single metallization operation is needed to form the contacts for multiple devices. Furthermore, the contacts for all of the devices may be located in a common backplane of the SOC 300.

In some embodiments, the bendable substrate 302 may be a textile material such that the SOC 300 may be incorporated into a piece of apparel or another form of wearable device. In some embodiments, the bendable substrate 302 may be attached to a textile material in order to incorporate the SOC 300 into a piece of apparel or another form of wearable device.

In some embodiments, the SOC 300 may further include a battery, a solar cell, or another power source. The power source may be coupled to the various IC devices to provide power thereto. In some embodiments, the power source may be formed as a layer of the device, such as from a layer of amorphous silicon as discussed previously with reference to stack 200.

Figure 4:
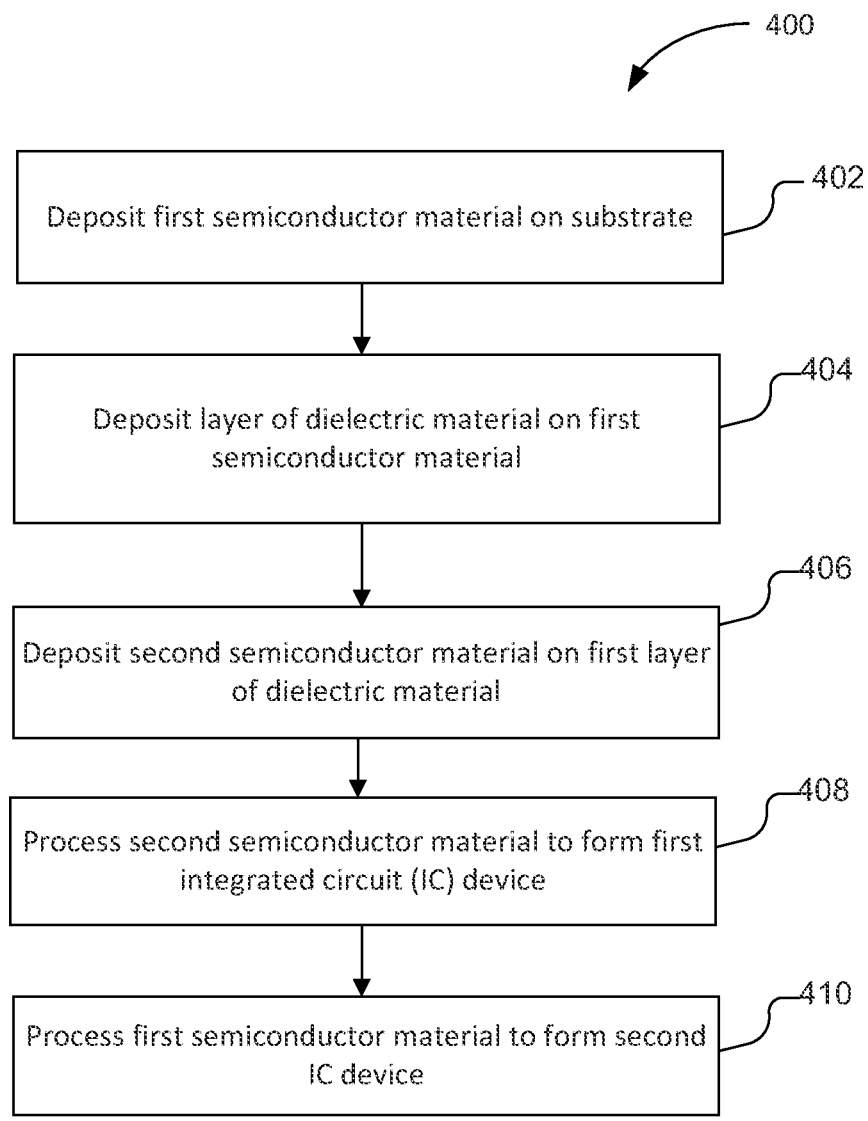
FIG. 4 schematically illustrates a flow diagram of a method of fabricating a multi-device SOC, in accordance with some embodiments.

FIG. 4 illustrates a method 400 of fabricating a multi-device SOC, in accordance with some embodiments. The method 400 may begin at 402 with depositing a first semiconductor material on a substrate. Any suitable technique may be used to perform this operation. This may include depositing the first semiconductor material directly on the substrate, or depositing the first semiconductor on a layer (such as a layer of ILD material) that is between the semiconductor material and the substrate.

The method 400 may continue at 404 with depositing a layer of dielectric material on the first semiconductor material. Any suitable technique may be used to perform this operation. This may include depositing the dielectric material directly on the semiconductor material, or it may include depositing the dielectric material on a layer directly or indirectly in contact with the semiconductor material.

The method 400 may continue at 406 with depositing a second semiconductor material on the dielectric material. Any suitable technique may be used to perform this operation. This may include depositing the second semiconductor material directly on the dielectric layer or on a layer between the second semiconductor material and dielectric layer.

In general, operations 402 through 406 may be considered stack fabrication operations and involve forming a multi-layer stack for future processing. This may correspond to forming a stack such as stack 200 in FIG. 2. Although only two semiconductor material layers are discussed, any number may be used (for instance, three semiconductor layers are shown in FIG. 2). Operations 404 and 406 may be repeated to form a stack with additional semiconductor layers. In some embodiments, the number of semiconductor layers may correspond to the number of IC devices to be fabricated. In some embodiments, multiple IC devices may be fabricated within a single layer of semiconductor material.

The method 400 may continue at 408 when a first IC device is formed by processing the second semiconductor material. Any suitable techniques may be used to form the first IC device. This operation may include a plurality of sub-operations associated with IC device fabrication. The specific sub-operations will vary depending upon the semiconductor material being processed and the type of IC device being formed. In general, the layers are deposited from the bottom up, building up the stack, and then subsequently processed from the top down. In this manner, the last layer deposited may be the first layer processed. In some embodiments, the layers may be arranged such that the processing operations associated with higher processing temperatures (such as a maximum processing temperature) may be completed before processing operations associated with lower processing temperatures. In this manner, the uppermost semiconductor layer (farthest from the substrate) may be associated with the highest processing temperatures while the lowermost semiconductor layer (closest to the substrate) may be associated with the lowest processing temperatures. The intervening layers may shield the lower semiconductor layers (associated with lower processing temperatures) from the high processing temperatures associated with processing the upper semiconductor layers.

The method 400 may continue at 410 when a second IC device is formed by processing the first semiconductor material. Any suitable techniques may be used to form the second IC device. This operation may include a plurality of sub-operations associated with IC device fabrication. The specific sub-operations will vary depending upon the semiconductor material being processed and the type of IC device being formed. As mentioned above, a maximum processing temperature associated with operation 410 may be less than a maximum processing temperature associated with operation 408.

While only two processing operations 408, 410 are shown, any number of processing operations may be used. As discussed above, more than two layers of semiconductor material may be used. In some embodiments, at least one processing operation may be associated with each semiconductor layer to form an IC device therefrom. In some embodiments, more than one processing operation may be associated with a single semiconductor layer in order to form multiple IC devices within a single layer. In some embodiments, it may be possible to form multiple IC devices in a single layer simultaneously through a single processing operation, rather than performing different processing operations to form different IC devices.

After all of the IC devices are formed, a metallization process may be used to form electrical connections to the different IC devices. This may include forming contacts such as those discussed previously with reference to FIG. 3. In this manner, a single metallization process may be used to form contacts for all of the IC devices. This may also allow all of the contacts to be located in a common back-plane of the SOC.

Figure 5:
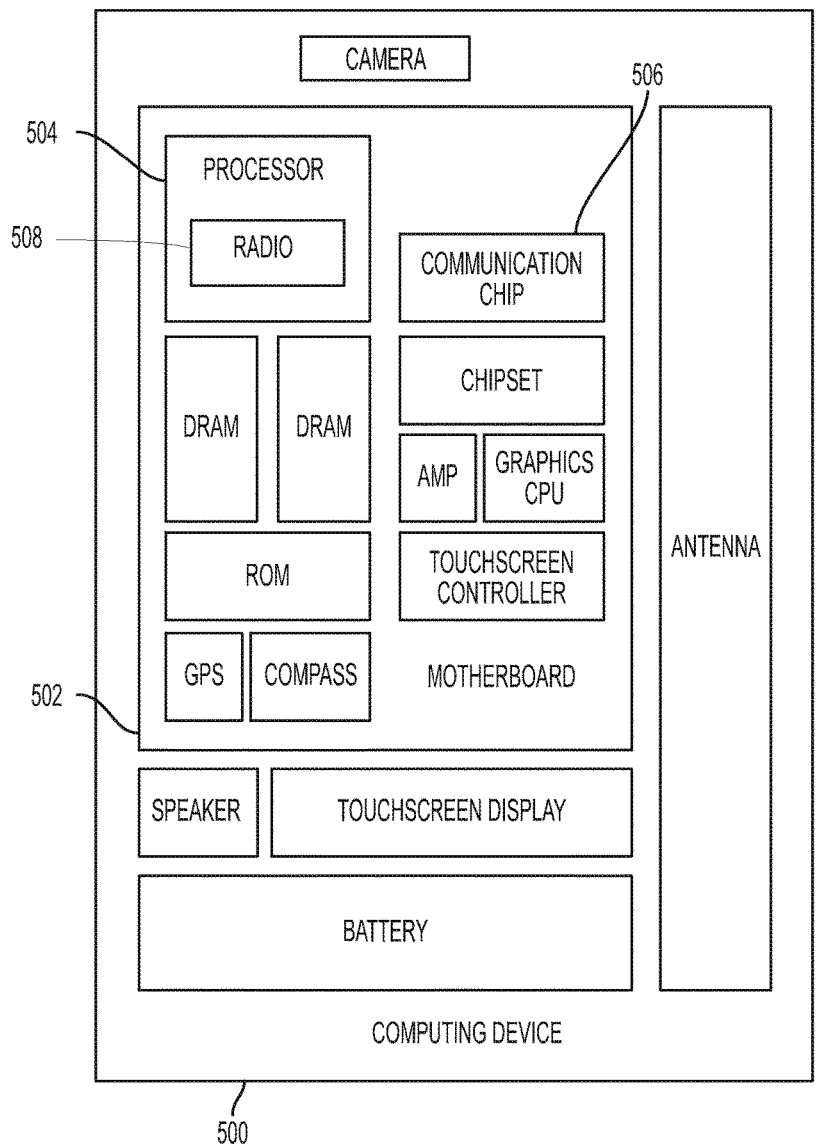
FIG. 5 schematically illustrates a computing device that includes a multi-device SOC as described herein, in accordance with some embodiments.

Embodiments of the present disclosure may be implemented into a system using any suitable hardware and/or software to configure as desired. FIG. 5 schematically illustrates a computing device 500 that includes an SOC assembly (e.g., SOC 300 of FIG. 3) as described herein, in accordance with some embodiments. The computing device 500 may include a housing to house a board such as motherboard 502. Motherboard 502 may include a number of components, including but not limited to processor 504 and at least one communication chip 506. Processor 504 may be physically and electrically coupled to motherboard 502. In some implementations, the at least one communication chip 506 may also be physically and electrically coupled to motherboard 502. In further implementations, communication chip 506 may be part of processor 504. In some embodiments, portions of the computing device 500 may encompass different flexible SOCs. In some embodiments, all of the components may be incorporated into a single flexible SOC. As such, in some embodiments, motherboard 502 may be a flexible device. As shown, in addition to communication chip 506, the computing device 500 may include a radio 508. As shown, the radio 508 and processor 504 may be formed as an SOC, such as SOC 300.

Depending on its applications, computing device 500 may include other components that may or may not be physically and electrically coupled to motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

Communication chip 506 or radio 508 may enable wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. Communication chip 506 or radio 508 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 506 and radio 508 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. Communication chip 506 and radio 508 may operate in accordance with other wireless protocols in other embodiments.

Computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, EV-DO, and others. As shown, computing device 500 may include one or more communication chips 506 as well as one or more radios 508.

Processor 504 of computing device 500 may be packaged in an SOC (e.g., SOC 300 as described herein). For example, processor 504 may correspond with Si logic device 310. The SOC and motherboard 502 may be coupled together using package-level interconnects such as BGA balls or other interconnect structures. In some embodiments, motherboard 502 may be a flexible device. The term "processor" may refer to any device or portion of a device that processes electronic data from registers and/or memory to transform that electronic data into other electronic data that may be stored in registers and/or memory.

Communication chip 506 or radio 508 may also be a part of an SOC (e.g., SOC 300) as described herein. In further implementations, another component (e.g., memory device or other integrated circuit device) housed within computing device 500 may be a part of an SOC (e.g., SOC 300) as described herein. In one implementation, all of the IC devices may be part of one or more SOCs to form a flexible computing device.

In various implementations, computing device 500 may be a laptop, a netbook, a notebook, an Ultrabook™, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data. In further implementations, the computing device 500 may be incorporated into a piece of apparel or another form of wearable device.

Various operations are described as multiple discrete operations in turn, in a manner that is most helpful in understanding the claimed subject matter. However, the order of description should not be construed as to imply that these operations are necessarily order dependent.

EXAMPLES

Some non-limiting examples are provided below.

Example 1 includes a flexible integrated circuit (IC) apparatus comprising: a flexible substrate; a first IC device comprising a first semiconductor material disposed on the flexible substrate; a first layer of dielectric material disposed on the first IC device; and a second IC device comprising a second semiconductor material disposed on the first layer of dielectric material.

Example 2 includes the apparatus of example 1, further comprising: a second layer of dielectric material disposed on the second IC device; and a third IC device disposed on the second layer of dielectric material.

Example 3 includes the apparatus of example 2, wherein the third IC device includes a radio frequency device.

Example 4 includes the apparatus of example 1, further comprising: a first contact electrically coupled to a transistor associated with the first IC device; and a second contact electrically coupled to a transistor associated with the second IC device; wherein the first contact and the second contact are located in substantially the same plane.

Example 5 includes the apparatus of any of examples 1-4, wherein the second IC device includes a silicon-based logic device.

Example 6 includes the apparatus of any of examples 1-4, wherein the first IC device includes a display device.

Example 7 includes the apparatus of any of examples 1-4, wherein the first IC device is an indium gallium zinc oxide based device.

Example 8 includes the apparatus of any of examples 1-4, wherein the flexible substrate is a textile material.

Example 9 includes the apparatus of any of examples 1-4, further comprising an amorphous silicon layer coupled to the first IC device Example 10 includes a method for fabricating a flexible device, the method comprising: depositing a layer of a first semiconductor material on a substrate; depositing a first layer of dielectric material on the first semiconductor material; depositing a layer of a second semiconductor material on the first layer of dielectric material; processing the second semiconductor material to form a first integrated circuit (IC) device; processing the first semiconductor material to form a second IC device; wherein the first and second semiconductor materials have different chemical compositions.

Example 11 includes the method of example 10, further comprising: depositing a second layer of dielectric material on the second semiconductor material; depositing a layer of a third semiconductor material on the second layer of dielectric material; and processing the third semiconductor material to form a third IC device.

Example 12 includes the method of example 11, wherein the third IC device is formed before the first IC device.

Example 13 includes the method of example 12, wherein a maximum processing temperature associated with forming the third IC device is greater than a maximum processing temperature associated with forming the first IC device.

Example 14 includes the method of example 11, wherein the third semiconductor material has a chemical composition different from the first and second semiconductor materials.

Example 15 includes the method of any of examples 10-14, wherein the first IC device is formed before the second IC device.

Example 16 includes the method of example 15, wherein a maximum processing temperature associated with forming the first IC device is greater than a maximum processing temperature associated with forming the second IC device.

Example 17 includes the method of any of examples 10-14, further comprising forming electrical connections to transistors associated with the first and second IC devices such that contacts associated with the first and second IC devices are located substantially in the same plane.

Example 18 includes the method of any of examples 10-14, further comprising: transferring the plurality of layers to a flexible substrate.

Example 19 includes the method of example 10, wherein the first and second semiconductor materials are both selected from the list comprising: silicon (Si), indium gallium zinc oxide (IGZO), and gallium nitride (GaN).

Example 20 includes the method of any of examples 10-14, wherein processing the first semiconductor material to form the second IC device includes patterning the first IC device using a masking process.

Example 21 includes a flexible computing device comprising: a flexible substrate; a first IC device disposed on the flexible substrate; a first layer of dielectric material disposed on the first IC device; a second IC device disposed on the first layer of dielectric material; and a power supply coupled to both first and second IC devices.

Example 22 includes the computing device of example 21, wherein the flexible substrate defines a first side of the device and the device further includes a plurality of contacts disposed on a second side of the device disposed opposite to the first side.

Example 23 includes the computing device of example 21, wherein the computing device is incorporated into a piece of apparel.

Example 24 includes the computing device of example 21, wherein the first IC device includes a display and the second IC device includes one of a silicon-based logic or a gallium nitride based radio device.

Example 25 includes the computing device of any of examples 21-24, wherein: the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the substrate.

Various embodiments may include any suitable combination of the above-described embodiments, including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed, result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A flexible integrated circuit (IC) apparatus comprising:
a flexible substrate;
a first IC device comprising a first semiconductor material on the flexible substrate;
a first layer of dielectric material on the first IC device; and
a second IC device comprising a second semiconductor material on the first layer of dielectric material, wherein the second IC device includes a silicon-based logic device.

2. The apparatus of claim 1, further comprising:
a second layer of dielectric material on the second IC device; and
a third IC device on the second layer of dielectric material.

3. The apparatus of claim 2, wherein the third IC device includes a radio frequency device.

4. The apparatus of claim 1, further comprising:
a first contact electrically coupled to a transistor associated with the first IC device; and
a second contact electrically coupled to a transistor associated with the second IC device;
wherein the first contact and the second contact are located in substantially a same plane.

5. The apparatus of claim 1, wherein the first IC device includes a display device.

6. The apparatus of claim 1, wherein the first IC device is an indium gallium zinc oxide based device.

7. The apparatus of claim 1, wherein the flexible substrate is a textile material.

8. The apparatus of claim 1, further comprising an amorphous silicon layer coupled to the first IC device.

9. A flexible computing device comprising:
a flexible substrate, wherein the flexible substrate defines a first side of the device;
a first IC device on the flexible substrate;
a first layer of dielectric material on the first IC device;
a second IC device on the first layer of dielectric material;
a plurality of contacts on a second side of the device opposite to the first side; and
a power supply coupled to the first and second IC devices.

10. The computing device of claim 9, wherein the computing device is incorporated into a piece of apparel.

11. The computing device of claim 9, wherein the first IC device includes a display and the second IC device includes one of a silicon-based logic or a gallium nitride based radio device.

12. The computing device of claim 9, wherein:
the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the substrate.

13. A flexible integrated circuit (IC) apparatus comprising:
a flexible substrate;
a first IC device comprising a first semiconductor material on the flexible substrate;
a first layer of dielectric material on the first IC device;
a second IC device comprising a second semiconductor material on the first layer of dielectric material;
a second layer of dielectric material on the second IC device; and
a third IC device on the second layer of dielectric material, wherein the third IC device includes a radio frequency device.

14. The apparatus of claim 13, further comprising:
a first contact electrically coupled to a transistor associated with the first IC device; and
a second contact electrically coupled to a transistor associated with the second IC device;
wherein the first contact and the second contact are located in substantially a same plane.

15. The apparatus of claim 13, wherein the first IC device includes a display device, and wherein the second IC device includes a logic device.

16. The apparatus of claim 13, wherein the flexible substrate is a textile material.

17. The apparatus of claim 13, further comprising an amorphous silicon layer coupled to the first IC device.

18. A flexible integrated circuit (IC) apparatus comprising:
a flexible substrate;
a first IC device comprising a first semiconductor material on the flexible substrate;
a first layer of dielectric material on the first IC device;
a second IC device comprising a second semiconductor material on the first layer of dielectric material;
a first contact electrically coupled to a transistor associated with the first IC device; and
a second contact electrically coupled to a transistor associated with the second IC device;
wherein the first contact and the second contact are located in substantially a same plane.

19. The apparatus of claim 18, wherein the first IC device includes a display device, and wherein the second IC device includes a logic device or a radio frequency device.

20. A flexible integrated circuit (IC) apparatus comprising:
a flexible substrate, wherein the flexible substrate is a textile material;
a first IC device comprising a first semiconductor material on the flexible substrate;
a first layer of dielectric material on the first IC device; and
a second IC device comprising a second semiconductor material on the first layer of dielectric material.

21. The apparatus of claim 20, wherein the first IC device includes a display device, and wherein the second IC device includes a logic device or a radio frequency device.

22. A flexible integrated circuit (IC) apparatus comprising:
a flexible substrate;
a first IC device comprising a first semiconductor material on the flexible substrate;
a first layer of dielectric material on the first IC device;
a second IC device comprising a second semiconductor material on the first layer of dielectric material; and
an amorphous silicon layer coupled to the first IC device.

23. The flexible IC apparatus of claim 22, wherein the amorphous silicon layer is to provide electrical power to the first IC device.

24. A flexible computing device comprising:
a flexible substrate;
a first IC device on the flexible substrate;
a first layer of dielectric material on the first IC device;

a second IC device on the first layer of dielectric material; and a power supply coupled to the first and second IC devices;

wherein the computing device is incorporated into a piece of apparel.

25. The flexible computing device of claim 24, wherein the flexible substrate is a textile material.

26. A flexible computing device comprising:

a flexible substrate;

a first IC device on the flexible substrate, wherein the first IC device includes a display;

a first layer of dielectric material on the first IC device;

a second IC device on the first layer of dielectric material, wherein the second IC device includes a silicon-based logic device or a gallium nitride-based radio device; and a power supply coupled to the first and second IC devices.

27. The flexible computing device of claim 26, wherein the flexible substrate is a textile material.

* * * * *